US009068279B2

(12) United States Patent
Jiunn-Yih et al.

(10) Patent No.: US 9,068,279 B2
(45) Date of Patent: Jun. 30, 2015

(54) EPITAXIAL SUBSTRATE HAVING NANO-RUGGED SURFACE AND FABRICATION THEREOF

(75) Inventors: Chyan Jiunn-Yih, Hsinchu (TW); Yeh Jer-Liang, Hsinchu (TW); Hsu Wen-Ching, Hsinchu (TW); Ho Suz-Hua, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 561 days.

(21) Appl. No.: 13/067,710

(22) Filed: Jun. 22, 2011

(65) Prior Publication Data
US 2012/0015143 A1    Jan. 19, 2012

(30) Foreign Application Priority Data

Jul. 15, 2010   (TW) ............................... 99123227 A (51) Int. Cl.
| *H01L 21/302* | (2006.01) |
| *C30B 29/60* | (2006.01) |
| *H01L 21/306* | (2006.01) |
| *H01L 21/308* | (2006.01) |
| *H01L 21/3065* | (2006.01) |
| *B82Y 30/00* | (2011.01) |
| *B82Y 40/00* | (2011.01) |
| *H01L 21/02* | (2006.01) |

(52) U.S. Cl.
CPC ......... *C30B 29/60* (2013.01); *Y10T 428/24355* (2015.01); *H01L 21/30604* (2013.01); *H01L 21/3086* (2013.01); *H01L 21/3065* (2013.01); *B82Y 30/00* (2013.01); *B82Y 40/00* (2013.01); *H01L 21/0237* (2013.01); *H01L 21/0243* (2013.01); *H01L 21/02521* (2013.01); *H01L 21/02658* (2013.01)

(58) Field of Classification Search
CPC ..................... H01L 21/30604; H01L 21/3065; H01L 21/3086; H01L 21/32; H01L 21/0243; H01L 21/0258; H01L 33/10; H01L 33/22; B82Y 40/00
See application file for complete search history.

(56) References Cited

U.S. PATENT DOCUMENTS

2011/0012154 A1 *   1/2011   Okagawa et al. ............... 257/98

FOREIGN PATENT DOCUMENTS

WO       WO2009084325       *   7/2009    ............. H01L 33/00

OTHER PUBLICATIONS

J.H. Kang et al., "Improvement of Light Output Power in InGaN/GaN Light-Emitting Diodes with a Nanotextured GaN Surface Using Indium Tin Oxide Nanospheres", Japanese Journal of Applied Physics, vol. 48, year 2009, pp. 102104-1 to 102104-4.*

* cited by examiner

*Primary Examiner* — Lan Vinh
*Assistant Examiner* — Jiong-Ping Lu
(74) *Attorney, Agent, or Firm* — Osha Liang LLP (57) ABSTRACT

The invention provides an epitaxial substrate and fabrication thereof. The epitaxial substrate according to the invention includes a crystalline substrate. In particular, the crystalline substrate has an epitaxial surface which is nano-rugged and non-patterned. The epitaxial substrate according to the invention thereon benefits a compound semiconductor material in growth of epitaxy films with excellent quality. Moreover, the fabrication of the epitaxial substrate according to the invention has advantages of low cost and rapid production.

4 Claims, 8 Drawing Sheets

EPITAXIAL SUBSTRATE HAVING NANO-RUGGED SURFACE AND FABRICATION THEREOF

CROSS-REFERENCE TO RELATED APPLICATION

This utility application claims priority to Taiwan Application Serial Number 099123227, filed Jul. 15, 2010, which is incorporated herein by reference.

BACKGROUND OF THE INVENTION

1. Field of the Invention

The invention relates to an epitaxial substrate and fabrication thereof, and more in particular, to an epitaxial substrate having a nano-rugged and non-patterned epitaxial surface and fabrication thereof.

2. Description of the Prior Art

Compound semiconductor materials, such as GaN, AlGaN, AlInGaN, and other III-V group compounds, or CdTe, ZnO, ZnS, and other II-VI group compounds, have been used for a wide variety of substrates of microelectronic devices including transistors, field emission devices, and optoelectronic devices, but not limiting the above described.

Taking a GaN-based microelectronic device as an example, a major problem in manufacture is that the GaN semiconductor layer manufactured must have low defect density to ensure the performance of the GaN-based microelectronic device. It is understood that one of these contributors for defects is the lattice mismatch between the substrate and the GaN layers grown on the substrate. Therefore, though the GaN layer has been grown on the sapphire substrate, but it is well known that the GaN layer is preferably grown on the AlN buffer layer previously formed on the SiC substrate to reduce the defect density, especially to reduce the density of threading dislocations. Even though there are these considerable progresses, it is still the goal desired to reach to reduce the defect density continuously on the research.

It is also well-known that the condition of epitaxy is controlled to achieve the lateral epitaxy by use of the substrate with patterned surface, which benefits in preferred orientation of epitaxy, to reduce the defect density or control defects. For example, a GaN semiconductor layer can be formed on the sapphire substrate with patterned surface in lateral epitaxial way to control dislocations in extending laterally to reduce the density of threading dislocations.

However, all of the prior arts regarding manufacture of the epitaxial substrate with patterned surface must utilize a photolithography process. Obviously, the prior arts regarding manufacture of the epitaxial substrate with patterned surface have high manufacture cost and slow production speed.

SUMMARY OF THE INVENTION

Accordingly, one scope of the invention is to provide an epitaxial substrate and fabrication thereof. In particular, an epitaxial surface of the epitaxial substrate according to the invention is non-patterned, but thereon still benefits a compound semiconductor material in lateral epitaxy to grow an epitaxial layer with excellent quality. Moreover, the method of manufacturing the epitaxial substrate according to the invention has advantages of low cost and rapid production.

An epitaxial substrate according to a preferred embodiment of the invention includes a crystalline substrate. The crystalline substrate has an epitaxial surface. In particular, the epitaxial surface of the crystalline substrate is nano-rugged and non-patterned.

A method of fabricating an epitaxial substrate, according to a preferred embodiment of the invention, firstly, is to prepare a crystalline substrate which has an epitaxial surface. Next, the method according to the invention is to deposit a poly-crystalline layer of a material on the epitaxial surface of the crystalline substrate. Then, the method according to the invention is to etch the grain boundaries of the poly-crystalline layer by a first wet etching process. Afterward, the method according to the invention is to take the etched poly-crystalline layer as a mask, and to etch the regions within the grain boundaries of the ploy-crystalline layer by a plasma etching process. Finally, the method according to the invention is to remove the etched poly-crystalline layer by a second wet etching process, where the epitaxial surface of the crystalline substrate is nano-rugged and non-patterned.

In one embodiment, the epitaxial surface of the crystalline substrate has an average surface roughness (Ra) in a range from 100 nm to 400 nm.

In one embodiment, the epitaxial surface of the crystalline substrate has a mean peak-to-valley height (Rz) in a range from 50 nm to 350 nm.

In practical application, the crystalline substrate can be formed of sapphire, SiC, GaN, GaAs, ZnO, Si, $ScAlMgO_4$, $SrCu_2O_2$, YSZ (Yttria-Stabilized Zirconia), $LiAlO_2$, $LiGaO_2$, $Li_2SiO_3$, $LiGeO_3$, $NaAlO_2$, $NaGaO_2$, $Na_2GeO_3$, $Na_2SiO_3$, $Li_3PO_4$, $Li_3AsO_4$, $Li_3VO_4$, $Li_2MgGeO_4$, $Li_2ZnGeO_4$, $Li_2CdGeO_4$, $Li_2MgSiO_4$, $Li_2ZnSiO_4$, $Li_2CdSiO_4$, $Na_2MgGeO_4$, $Na_2ZnGeO_4$, $Na_2ZnSiO_4$, or other commercial materials provided for epitaxy.

In practical application, the material to form the poly-crystalline layer can be Ge, ZnO, ZnS, CdSe, CdTe, CdS, ZnSe, InAs, InP, Si, or metal/silicide where the metal can be Al, Ni, Fe or other metal, and the silicide can be SiAl, SiZn, SiNi or other silicide.

In one embodiment, the poly-crystalline layer can be deposited on the epitaxial surface of the crystalline substrate by an LPCVD (low pressure chemical vapor deposition) process, an PECVD (plasma-enhanced chemical vapor deposition) process, a sputtering process, or a thermal evaporation process.

In one embodiment, the poly-crystalline layer has a thickness in a range from 20 nm to 2000 nm.

Compared to the prior arts, the epitaxial surface of the epitaxial substrate according to the invention is nano-rugged and non-patterned, and still benefits a compound semiconductor material in growing epitaxial layers with excellent quality. Moreover, the method of manufacturing the epitaxial substrate according to the invention has advantages of low cost and rapid production.

The advantage and spirit of the invention may be understood by the following recitations together with the appended drawings.

DETAILED DESCRIPTION OF THE INVENTION

Figure 1:
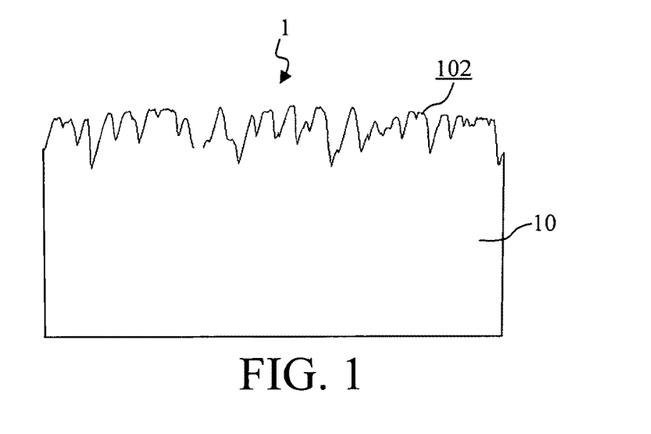
FIG. 1 illustratively shows an epitaxial substrate with nano-rugged and non-patterned surface according to a preferred embodiment of the invention.

Referring to FIG. 1, FIG. 1 is a cross-sectional view of an epitaxial substrate 1 according to a preferred embodiment of the invention. The epitaxial substrate 1 can be provided for a compound semiconductor material in epitaxy, such as GaN, AlGaN, AlInGaN, or other III-V group compounds, or CdTe, ZnO, ZnS, or other II-VI group compounds.

As shown in FIG. 1, the epitaxial substrate 1 according to the invention includes a crystalline substrate 10. The crystalline substrate 10 has an epitaxial surface 102.

Different from the prior arts, the epitaxial surface 102 of the crystalline substrate 10 is nano-rugged and non-patterned. It is noted that similar to the epitaxial substrates with patterned surfaces of the prior arts, the epitaxial substrate 1 according to the invention can also benefit the compound semiconductor material in lateral epitaxy.

In one embodiment, the epitaxial surface 102 of the crystalline substrate 10 has an average surface roughness (Ra) in a range from 100 nm to 400 nm.

In one embodiment, the epitaxial surface 102 of the crystalline substrate 10 has a mean peak-to-valley height (Rz) in a range from 50 nm to 350 nm.

In practical application, the crystalline substrate 10 can be formed of sapphire, SiC, GaN, GaAs, ZnO, Si, ScAlMgO$_4$, SrCu$_2$O$_2$, YSZ (Yttria-Stabilized Zirconia), LiAlO$_2$, LiGaO$_2$, Li$_2$SiO$_3$, LiGeO$_3$, NaAlO$_2$, NaGaO$_2$, Na$_2$GeO$_3$, Na$_2$SiO$_3$, Li$_3$PO$_4$, Li$_3$Asa$_4$, Li$_3$VO$_4$, Li$_2$MgGeO$_4$, Li$_2$ZnGeO$_4$, Li$_2$CdGeO$_4$, Li$_2$MgSiO$_4$, Li$_2$ZnSiO$_4$, Li$_2$CdSiO$_4$, Na$_2$MgGeO$_4$, Na$_2$ZnGeO$_4$, Na$_2$ZnSiO$_4$, or other commercial materials provided for epitaxy.

Referring to FIGS. 2A through 2C and FIG. 1, these figures of sectional views illustratively show a method according to a preferred embodiment of the invention to fabricate the epitaxial substrate 1, for example, as shown in FIG. 1.

Figure 2A:
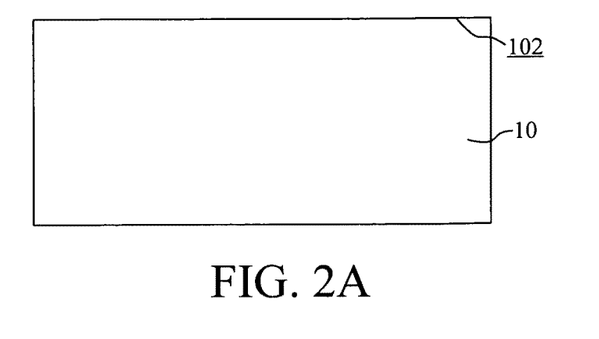
FIGS. 2A through 2C illustratively show a method according to a preferred embodiment of the invention to fabricate an epitaxial substrate, for example, as shown in FIG. 1.

As shown in FIG. 2A, the method according to the invention, firstly, is to prepare a crystalline substrate 10. The crystalline substrate 10 has an epitaxial surface 102.

In practical application, the crystalline substrate 10 can be formed of sapphire, SiC, GaN, GaAs, ZnO, Si, ScAlMgO$_4$, SrCu$_2$O$_2$, YSZ (Yttria-Stabilized Zirconia), LiAlO$_2$, LiGaO$_2$, Li$_2$SiO$_3$, LiGeO$_3$, NaAlO$_2$, NaGaO$_2$, Na$_2$GeO$_3$, Na$_2$SiO$_3$, Li$_3$PO$_4$, Li$_3$AsO$_4$, Li$_3$VO$_4$, Li$_2$MgGeO$_4$, Li$_2$ZnGeO$_4$, Li$_2$CdGeO$_4$, Li$_2$MgSiO$_4$, Li$_2$ZnSiO$_4$, Li$_2$CdSiO$_4$, Na$_2$MgGeO$_4$, Na$_2$ZnGeO$_4$, Na$_2$ZnSiO$_4$, or other commercial materials provided for epitaxy.

Figure 2B:
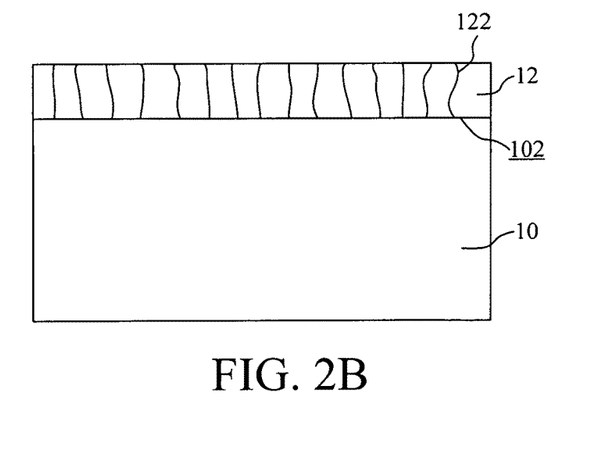

Next, the method according to the invention is to deposit a poly-crystalline layer 12 of a material on the epitaxial surface 102 of the crystalline substrate 10, as shown in FIG. 2B. Also shown in FIG. 2B, the poly-crystalline layer 12 has grain boundaries 122.

In practical application, the material to form the poly-crystalline layer 12 can be Ge, ZnO, ZnS, CdSe, CdTe, CdS, ZnSe, InAs, InP, Si, or metal/silicide where the metal can be Al, Ni, Fe or other metal, and the silicide can be SiAl, SiZn, SiNi or other silicide.

In one embodiment, the poly-crystalline layer 12 can be deposited on the epitaxial surface 102 of the crystalline substrate 10 by an LPCVD (low pressure chemical vapor deposition) process, an PECVD (plasma-enhanced chemical vapor deposition) process, a sputtering process, or a thermal evaporation process.

In one embodiment, the poly-crystalline layer 12 has a thickness in a range from 20 nm to 2000 nm.

Figure 2C:
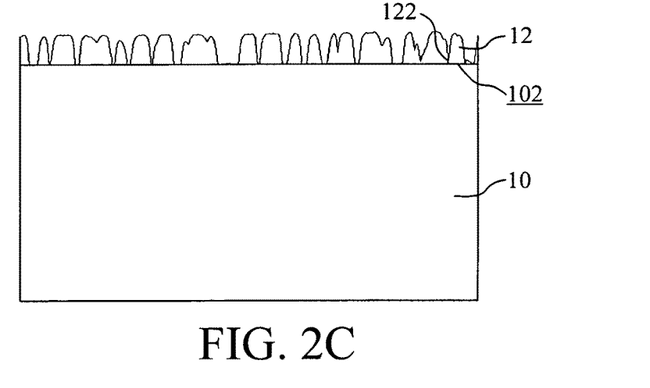

Then, the method according to the invention is to etch the grain boundaries 122 of the poly-crystalline layer 12 by a first wet etching process. The sectional view of the etched poly-crystalline 12 is shown in FIG. 2C.

In a case, taking a sapphire as the substrate 10, various etching solutions, which can be used to etch the grain boundaries 122 of poly-crystalline layer 12, and the compositions of these etching solutions are listed in Table 1. Table 1 lists four etching solutions including Secco solution, Sirtl solution, Wright solution, and Seiter solution.

TABLE 1

| etching solution | composition (Mol %) | | |
|---|---|---|---|
| | solvent [1] | HF | oxizers [2] |
| Secco | 67.6 | 32.2 | 0.17 |
| Sirtl | 71.2 | 26.3 | 2.5 |
| Wright | 78.5 | 16.1 | 5.4 |
| Seiter | 78.5 | 5.9 | 15.6 |

[1] H$_2$O + CH$_3$COOH(H$_{4c}$);
[2] CrO$_3$ + HNO$_3$

Furthermore, because the etching solutions listed in Table 1 cannot etch the sapphire substrate 10, these etching solutions can etch the grain boundaries 122 of the poly-crystalline layer 12 until the epitaxial surface 102 of the sapphire substrate 10 underneath the grain boundaries 122 is exposed. Otherwise, as the case, these etching solutions just etch the grain boundaries 122 of the poly-crystalline layer 12 to certain depth where the epitaxial surface 102 of the sapphire substrate 10 underneath the grain boundaries 122 is not exposed.

Afterward, the method according to the invention is to take the etched poly-crystalline layer 12 as a mask, and to etch the regions within the grain boundaries 122 of the ploy-crystalline layer 12 by a plasma etching process. Finally, the method according to the invention is to remove the etched poly-crystalline layer 12 by a second wet etching process, where the epitaxial surface 102 of the crystalline substrate 10 is nano-rugged and non-patterned.

In practice, the second wet etching process can use the etching solution as the same as that used in the first wet etching process.

In one embodiment, the epitaxial surface 102 of the crystalline substrate 10 has an average surface roughness (Ra) in a range from 100 nm to 400 nm.

In one embodiment, the epitaxial surface 102 of the crystalline substrate 10 has a mean peak-to-valley height (Rz) in a range from 50 nm to 350 nm.

In practice, the Ra and Rz values of the epitaxial surface 102 of the crystalline substrate 10 can be controlled by controlling the thickness and grain size of the poly-crystalline layer 12 and etching conditions.

Figure 3:
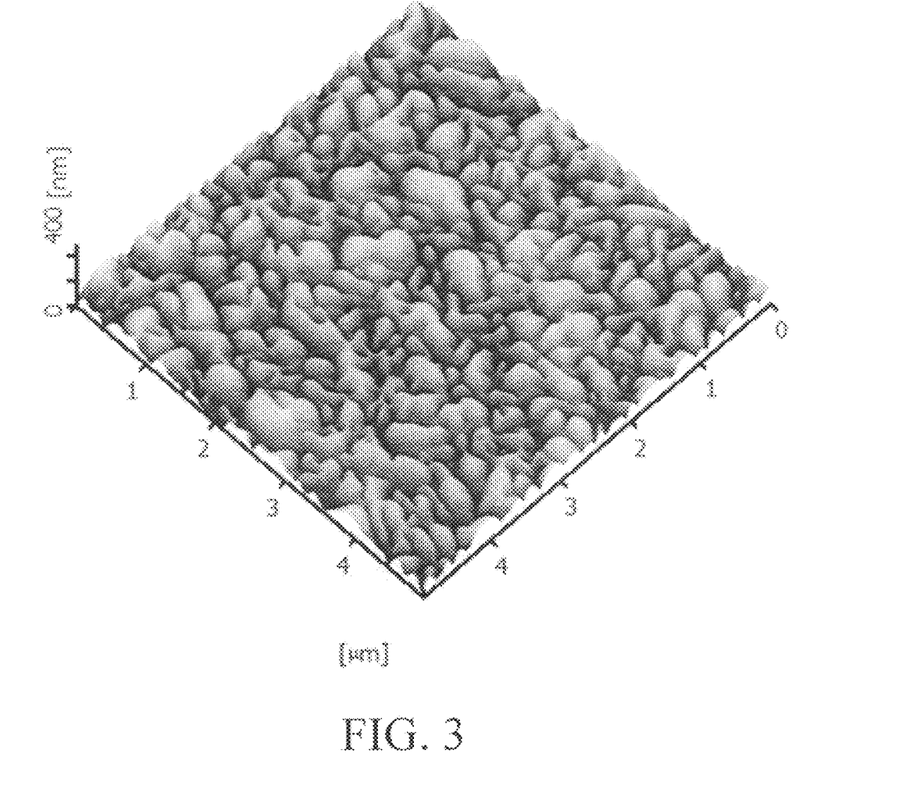
FIG. 3 is an atomic force microscopy image of morphology of a sapphire substrate fabricated according to the invention.

Taking a sapphire substrate as an example, the morphology of the sapphire substrate sample fabricated according to the invention is shown in FIG. 3 that is an atomic force microscopy (AFM) image. It is evident that the morphology of the epitaxial substrate exhibits nano-rugged and non-patterned surface.

Figure 4:
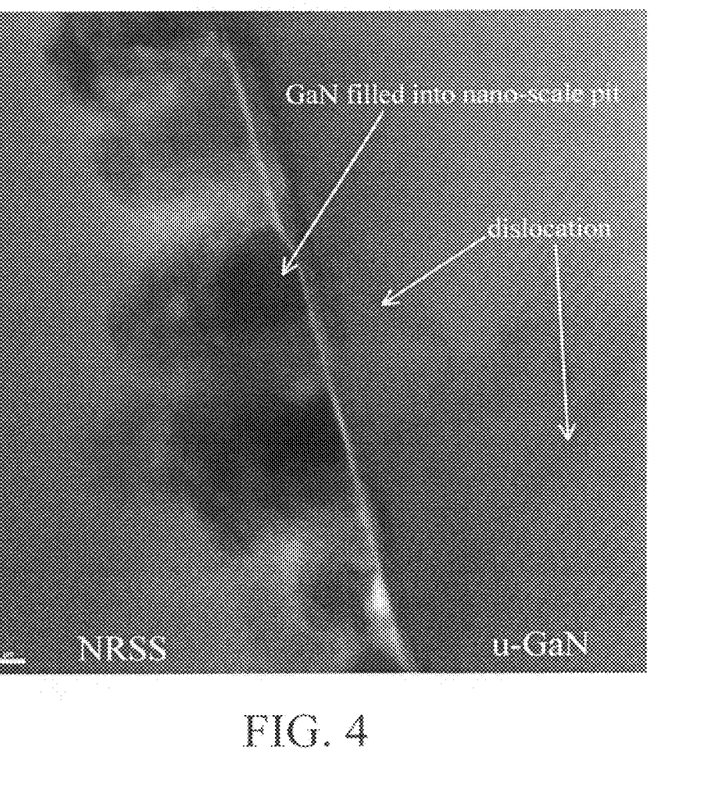
FIG. 4 is a transmission electron microscope image of an un-doped GaN layer grown on a sapphire substrate fabricated according to the invention.

A transmission electron microscope (TEM) image of a sapphire substrate sample (labeled as NRSS) fabricated according to the invention is shown in FIG. 4, and an un-doped GaN layer (labeled as u-GaN) grown on the epitaxial surface of the sapphire substrate is also shown in FIG. 4. FIG. 4 evidently shows that the un-doped GaN layer has low density of dislocations which are laterally extending dislocations rather than threading dislocations.

Figure 5A:
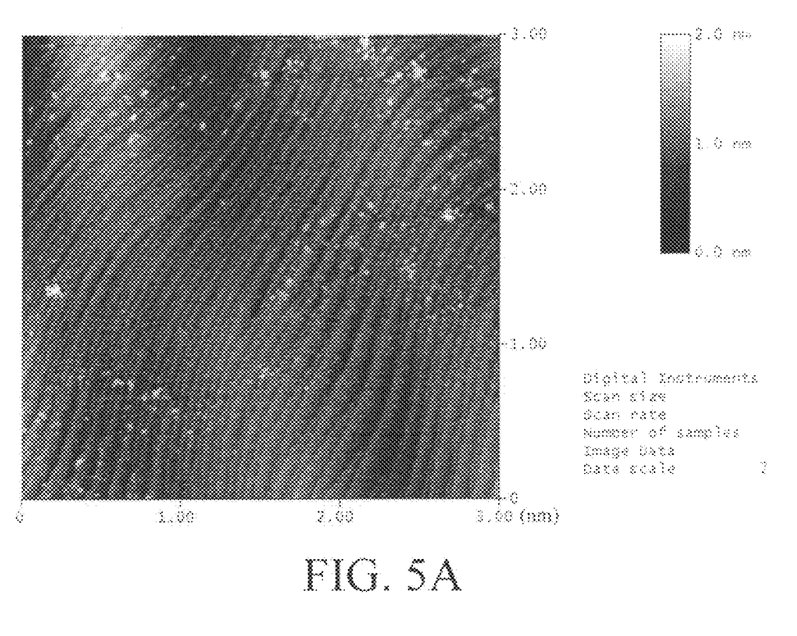
FIG. 5A is an atomic force microscopy image of an un-doped GaN layer grown on a sapphire substrate fabricated according to the invention.
Figure 5B:
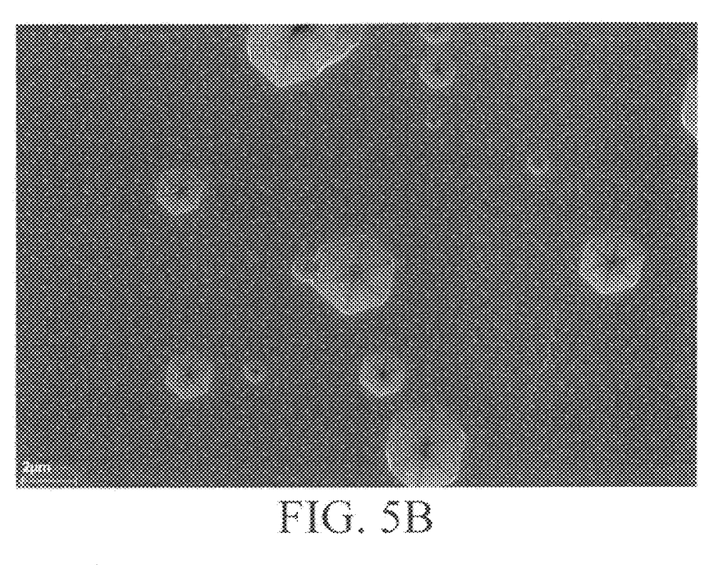
FIG. 5B is an SEM image of an etched un-doped GaN layer grown on a sapphire substrate fabricated according to the invention.
Figure 5C:
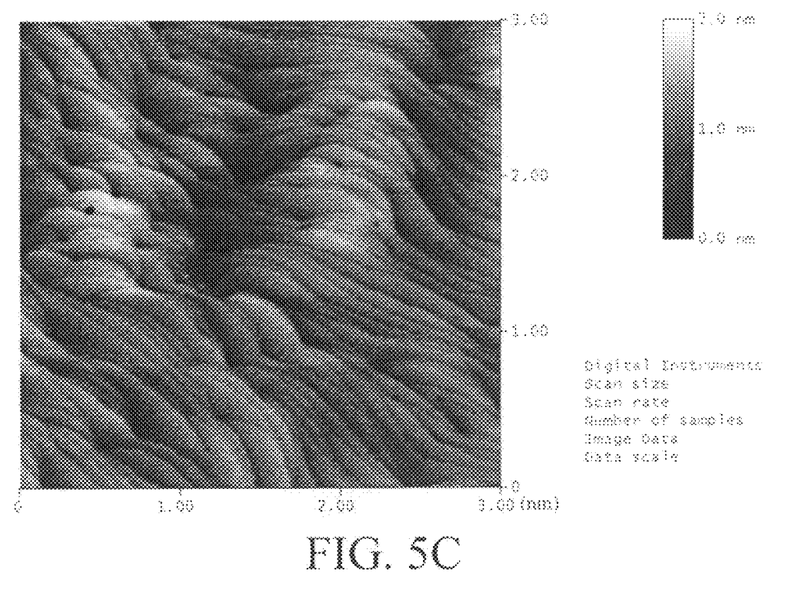
FIG. 5C is an atomic force microscopy image of an un-doped GaN layer grown on a sapphire substrate with smooth surface.

An AFM image of an un-doped GaN layer grown on the aforesaid NRSS sample is shown in FIG. 5A. The un-doped GaN layer grown on the NRSS sample is etched at 180° C. for 1 minute in KOH aqueous solution, an SEM image of the etched un-doped GaN layer is shown in FIG. 5B. The etched pits shown in FIG. 5B are just evidence of threading dislocations. By statistical counting, the density of threading dislocations of the un-doped GaN layer grown on the NRSS sample is about $3.6 \times 10^6$ cm$^{-2}$. In contrast, an AFM image of an un-doped GaN layer grown on a sapphire substrate with smooth surface is shown in FIG. 5C. Obviously, compared to FIG. 5A, FIG. 5C shows less smooth surface. By statistical counting, the density of threading dislocations of the un-doped GaN layer grown on the sapphire substrate with smooth surface is about $1 \times 10^9$ cm$^{-2}$. Obviously, compared to the epitaxial substrates with smooth epitaxial surface, the epitaxial substrate according to the invention can reduce density of dislocations, especially for density of threading dislocations.

Similar to the epitaxial substrates with patterned surfaces of the prior arts, the epitaxial substrate 1 with nano-rugged and non-patterned surface according to the invention can also benefit the compound semiconductor material in lateral epitaxy to reduce density of defects and to enhance quality of epitaxial layers. Table 2 lists measured photoelectric properties of sample labeled as NRSS that the GaN layer is grown on the sapphire substrate with nano-rugged and non-patterned surface fabricated according to the invention. In contrast, Table 2 also lists measured photoelectric properties of sample labeled as PSS that the GaN layer is grown on the sapphire substrate with patterned surface, and measured photoelectric properties of sample labeled as FSS that the GaN layer is grown on the sapphire substrate with smooth surface.

TABLE 2

| sample | forward voltage (Volt.) | peak emission wavelength (nm) | luminous intensity (a.u.) |
| --- | --- | --- | --- |
| NRSS | 3.71 | 457.21 | $5.71 \times 10^{-7}$ |
| PSS | 3.60 | 450.30 | $5.50 \times 10^{-7}$ |
| FSS | 3.69 | 459.51 | $3.33 \times 10^{-7}$ |

With photoelectric properties listed in Table 2, it is evident that the photoelectric properties of sample NRSS with sapphire substrate according to the invention are close to those of sample PSS with patterned sapphire substrate, and are better than those of sample FSS with smooth sapphire substrate.

It is emphasized that different from the prior arts, the method of fabricating the epitaxial substrate according to the invention is not only without the need of a photolithography process, and but also without the introduction of complicated process. Therefore, it is obvious that the method according to the invention has advantages of low manufacture cost and rapid production speed.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating an epitaxial substrate, comprising the steps of:
    preparing a crystalline substrate having an upper surface, wherein the crystalline substrate is formed of sapphire;
    depositing a poly-crystalline layer of silicon on the upper surface of the crystalline substrate, the poly-crystalline layer of silicon having a plurality of irregular grain boundaries;
    etching the grain boundaries of the poly-crystalline layer by a first wet etching process to obtain a plurality of irregular nano-scale poly-crystalline islands;
    taking the plurality of the irregular nano-scale poly-crystalline islands as a non-patterning mask, and etching the regions of the upper surface exposed between the plurality of irregular nano-scale poly-crystalline island by a plasma etching process to obtain a plurality of irregular nano-scale cavities of different depths; and
    removing the plurality of the irregular nano-scale poly-crystalline islands completely by a second wet etching process to obtain a nano-rugged, non-patterned epitaxial surface of the crystalline substrate.

2. The method of claim 1, wherein the nano-rugged, non-patterned epitaxial surface of the crystalline substrate has an average surface roughness (Ra) in a range from 100 nm to 400 nm.

3. The method of claim 1, wherein the nano-rugged, non-patterned epitaxial surface of the crystalline substrate has a mean peak-to-valley height (Rz) in a range from 50 nm to 350 nm.

4. The method of claim 1, wherein the poly-crystalline layer is deposited on the upper surface of the crystalline substrate by one selected from the group consisting of an LPCVD (low pressure chemical vapor deposition) process, an PECVD (plasma-enhanced chemical vapor deposition) process, a sputtering process, and a thermal evaporation process, and the poly-crystalline layer has a thickness in a range from 20 nm to 2000 nm.

* * * * *